(12) United States Patent
Chen

(10) Patent No.: US 6,749,445 B1
(45) Date of Patent: Jun. 15, 2004

(54) ELECTRICAL CONNECTOR WITH SPACER

(75) Inventor: Yen-Lin Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/328,871

(22) Filed: Dec. 23, 2002

(51) Int. Cl.[7] .............................................. H01R 1/00
(52) U.S. Cl. ............................................ 439/79; 439/65
(58) Field of Search ............................ 439/79, 541.5, 439/65, 80, 607–610, 590, 701

(56) References Cited

U.S. PATENT DOCUMENTS

| | | | |
|---|---|---|---|
| 5,382,168 A | * | 1/1995 | Azuma et al. ................ 439/65 |
| 5,879,171 A | | 3/1999 | Wu |
| 5,971,774 A | * | 10/1999 | Kuki et al. ................... 439/79 |
| 6,183,270 B1 | | 2/2001 | Huang et al. |
| 6,319,060 B1 | * | 11/2001 | Wu ............................ 439/607 |

\* cited by examiner

*Primary Examiner*—Alex Gilman
(74) *Attorney, Agent, or Firm*—Wei Te Chung

(57) ABSTRACT

An electrical connector (1) includes a housing (2) having at least a pair of engaging portions (203) and a number of passageways (22), a number of terminals (5), a shell (4), and a spacer (3). Each terminal has a mating portion (50) received in the passageway and a tail portion (51) extending downwardly beyond the housing. The spacer includes a pair of hooks (31) extending upwardly from opposite ends thereof and a number of positioning holes (303) for retaining the tail portions in position. Each hook has a first retention portion (32) and a second retention portion (33) positioned above the first retention portion. By means of gradual cooperation between engaging portions and the retention portions, the terminals are gradually oriented and guided by the holes of the spacer to be precisely inserted into a number of apertures defined in a printed circuit board without buckling.

8 Claims, 5 Drawing Sheets

ELECTRICAL CONNECTOR WITH SPACER

BACKGROUND OF THE INVENTION

1. Field of the Invention

The present invention is related to an electrical connector, and more particularly to an electrical connector having a spacer for positioning tails of a plurality of terminals thereof.

2. Description of Related Art

To increase the transmission speed of input/output messages between electrical connectors in electrical apparatus like computer systems, high density electrical connectors, which have a plurality of contacts in a high density arrangement, are proposed. However, the high density arrangement of the contacts results in a very small pitch between adjacent contacts. Therefore, high density electrical connectors are usually equipped with a spacer to orient contacts thereof and to prevent the contacts from coming too close to each other.

Some conventional high density electrical connectors each comprises a plurality of contacts, each of which comprises a horizontal portion extending horizontally to mate with a complementary element of a complementary connector and a vertical portion extending vertically and downwardly through a spacer assembled to the housing. The vertical portions are often too long to be exactly inserted into corresponding apertures of the printed circuit board, which results in the buckling of the contacts.

To solve the buckling problem of the contacts, U.S. Pat. Nos. 5,879,171 and 6,183,270 each discloses a two-stage locking means formed on a housing and a pair of latching portions formed on a spacer. By means of gradual cooperation between the two-stage locking means and the latching portions, the contacts are gradually oriented and guided in two stages through holes of the spacer.

Contacts of U.S. Pat. Nos. 5,879,171 and 6,183,270 have both horizontal and vertical portions and make the connectors using the same have a relatively large width and occupy relatively more space on a printed circuit board. Sometimes electrical connectors occupying less space are desired, which, however, often have a relatively stringent height limitation. Two-stage locking means formed on the housing increases the height of the connector.

Hence, it is requisite to provide an improved electrical connector to overcome the above-mentioned disadvantages.

SUMMARY OF THE INVENTION

Accordingly, an object of the present invention is to provide an electrical connector with a spacer without buckling contacts thereof.

Accordingly, another object of the present invention is to provide an electrical connector with a spacer for reducing both a width and a height of the electrical connector.

In order to achieve the object set forth, an electrical connector in accordance with the present invention comprises an insulative housing defining a plurality of passageways, a plurality of conductive terminals, a metal shell assembled onto the insulative housing and a spacer. The housing has a pair of blocks formed on opposite ends thereof. Each block has an engaging portion projecting sidewardly. Each terminal has a mating portion received in the passageway and a tail portion extending downwardly beyond the housing. The spacer includes a pair of hooks extending upwardly from opposite ends thereof and a plurality of positioning holes for retaining the tail portions of the terminals in position. Each hook has a first retention portion and a second retention portion positioned above the first retention portion. When the spacer is in a first position where the spacer is initially retained to the housing, the first retention portions of the spacer engage with the engaging portions of the housing. When the spacer is in a second position where the spacer is finally retained to the housing, the engaging portions of the housing engage with the second retention portions of the spacer.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
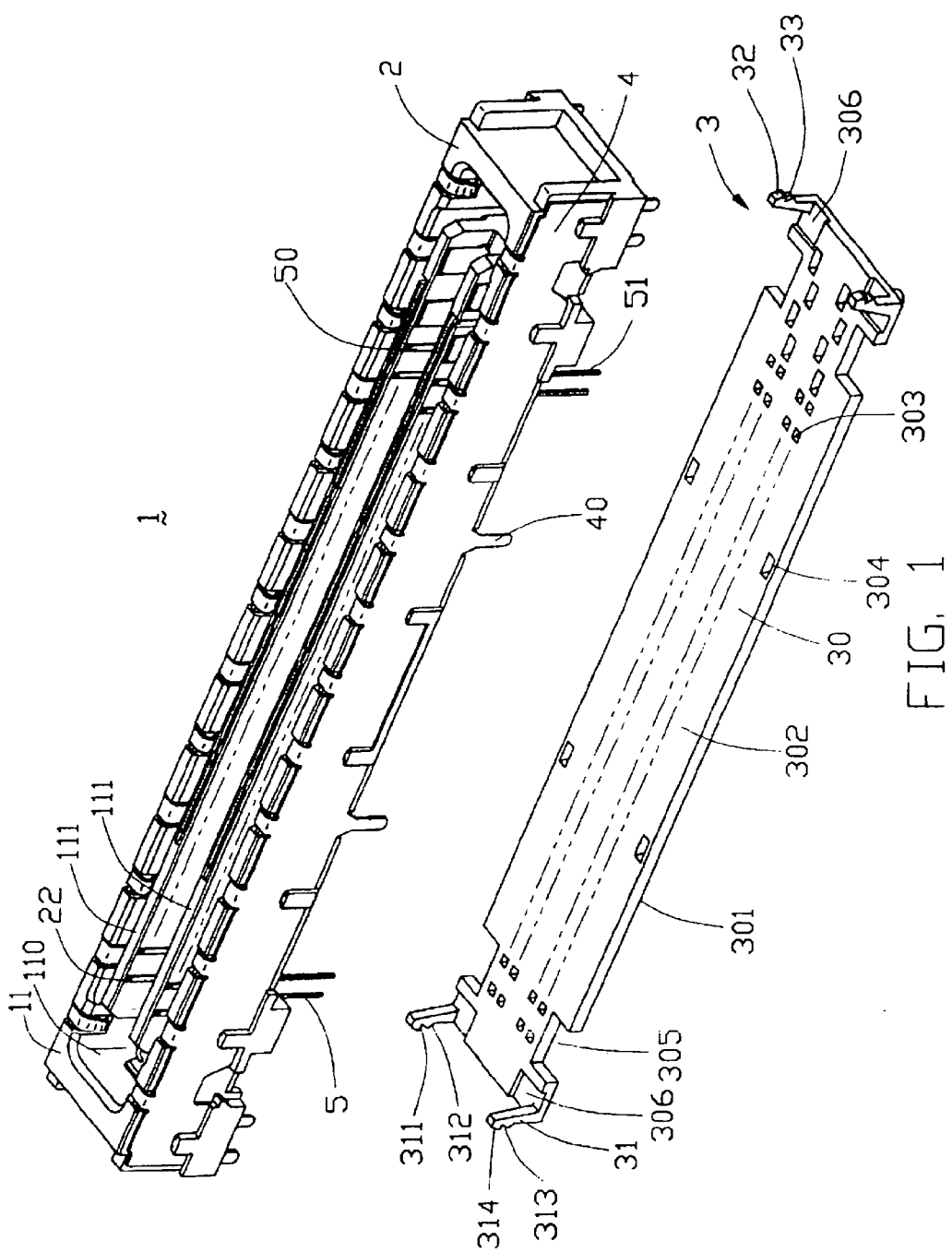
FIG. 1 is a perspective view of an electrical connector in accordance with the present invention with a spacer thereof exploded therefrom.
Figure 2:
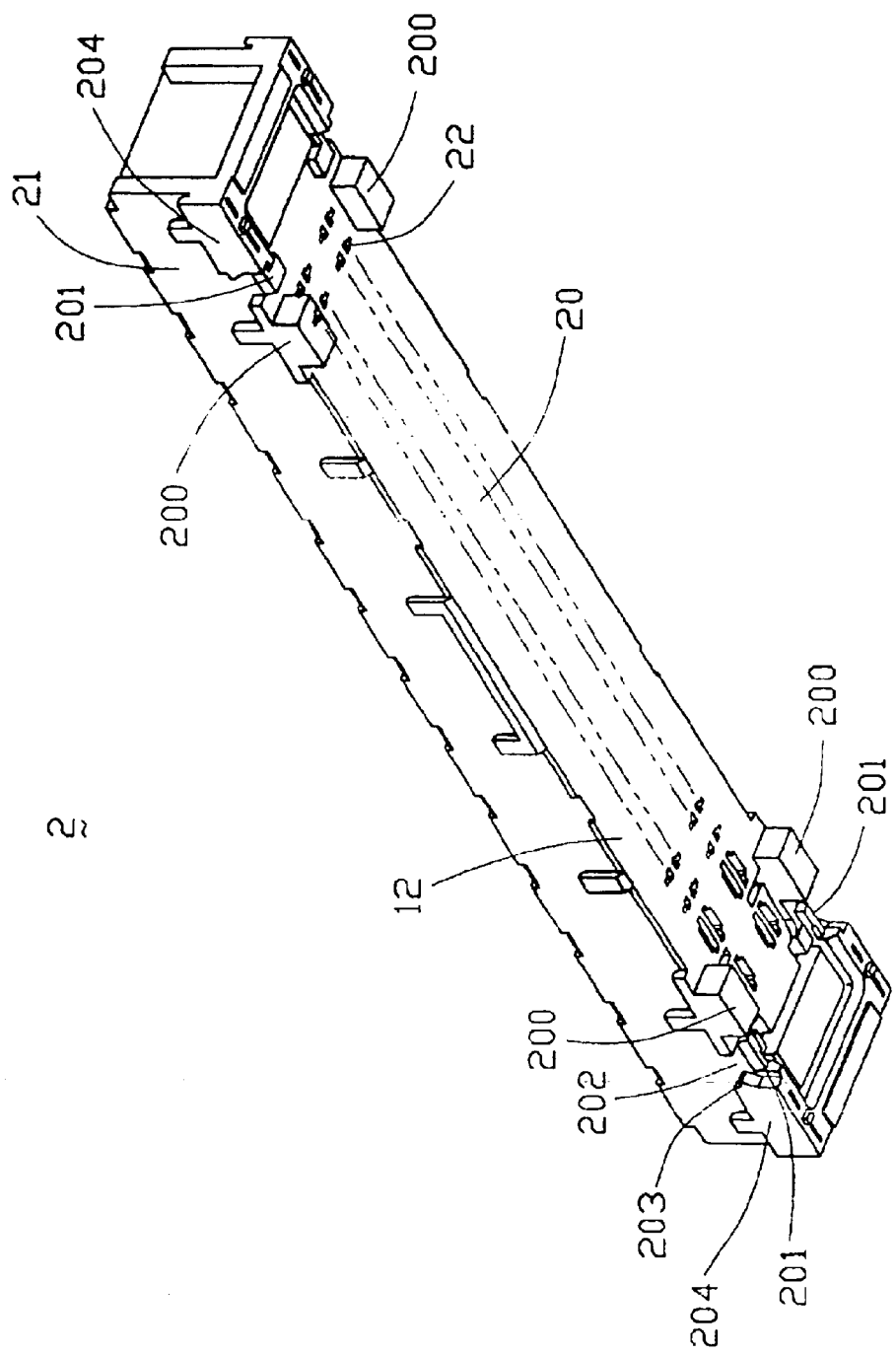
FIG. 2 is a perspective view of an insulative housing of the electrical connector from a bottom respect.

Referring to FIGS. 1 and 2, an electrical connector 1 in accordance with the present invention comprises an insulative housing 2, a pair of metal shells 4 mounted on opposite side walls 21 of the insulative housing 2, a plurality of terminals 5 retained to the housing 2 and a spacer 3.

The insulative housing 2 has an elongated configuration. The top surface of the insulative housing 2 is a mating face 11 and a lower surface opposite to the top surface is an engaging face 20. The engaging face 20 faces to a printed circuit board (not shown) to which the electrical connector 1 is mounted. The insulative housing 2 comprises a mating cavity 110 extending from the mating face 11 toward the engaging face 20 and two elongated mating tongues 111 extending longitudinally in the mating cavity 110. Each mating tongue 111 defines in opposite side surfaces thereof a plurality of passageways 22 extending downwardly through the insulative housing 2. A plurality of projections 200 are formed on opposite sidewalls 21 of the insulative housing 2 and extend downwardly beyond the engaging face 20 of the housing 2. Opposite ends of the insulative housing 2 respectively have a pair of blocks 204 integrally molded therewith. A receiving space 202 is defined between a block 204 and the projection 200 adjacent to the block 204. Each block 204 has an engaging portion 203 projecting sidewardly into the receiving space 202. A plurality of embossments 201 are formed on the engaging face 20 of the insulative housing 2. At least one of the projection 200 and the block 204 may function as the standoff for supporting the connector on the printed circuit board.

Each terminal 5 has a mating portion 50 received in the passageways 22 for electrically mating with corresponding terminals of a mating connector (not shown) complementary to the electrical connector 1 and a tail portion 51 extending beyond the engaging face 20 of the insulative housing 2 for soldering to the printed circuit board.

The shells 4 are attached to the sidewalls 21 of the insulative housing 2 for providing electro-magnetic shielding. Each shell 4 has a plurality of soldering tabs 40 extending downwardly therefrom.

Figure 3:
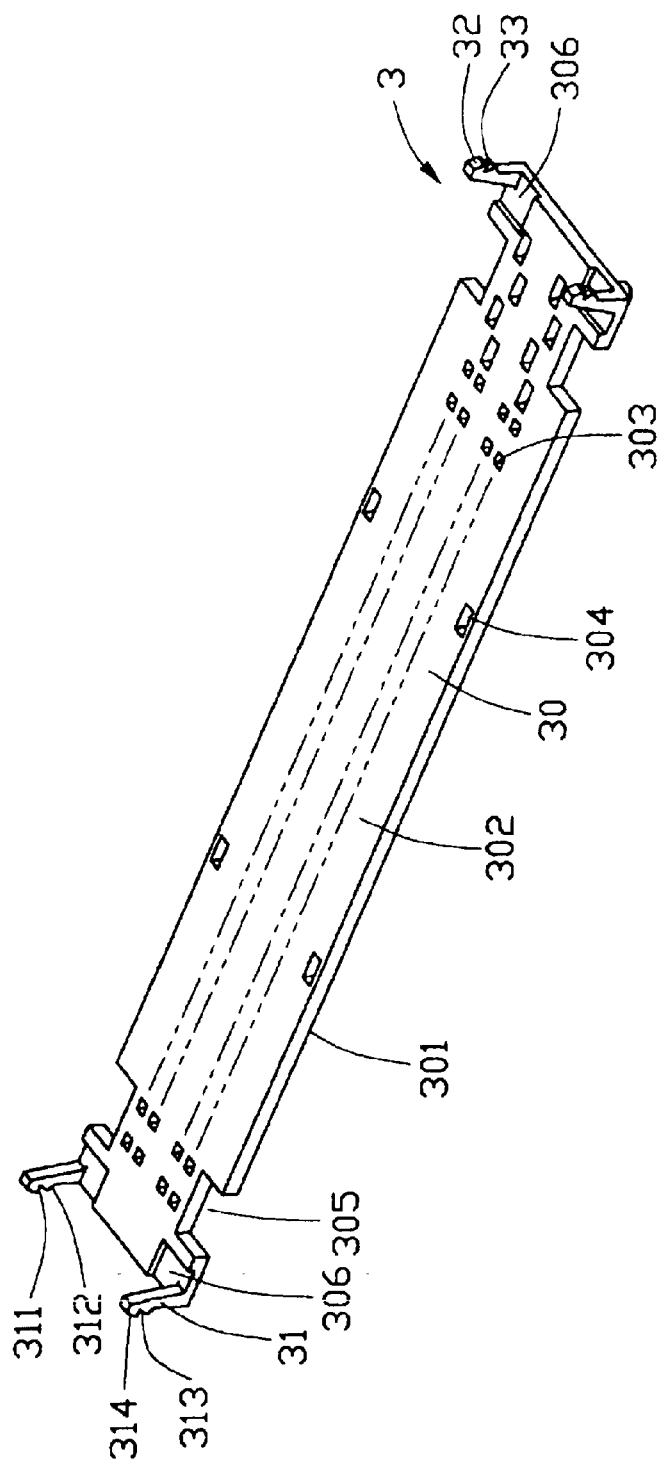
FIG. 3 is a top perspective view of the spacer of the electrical connector of FIG. 1.
Figure 4:
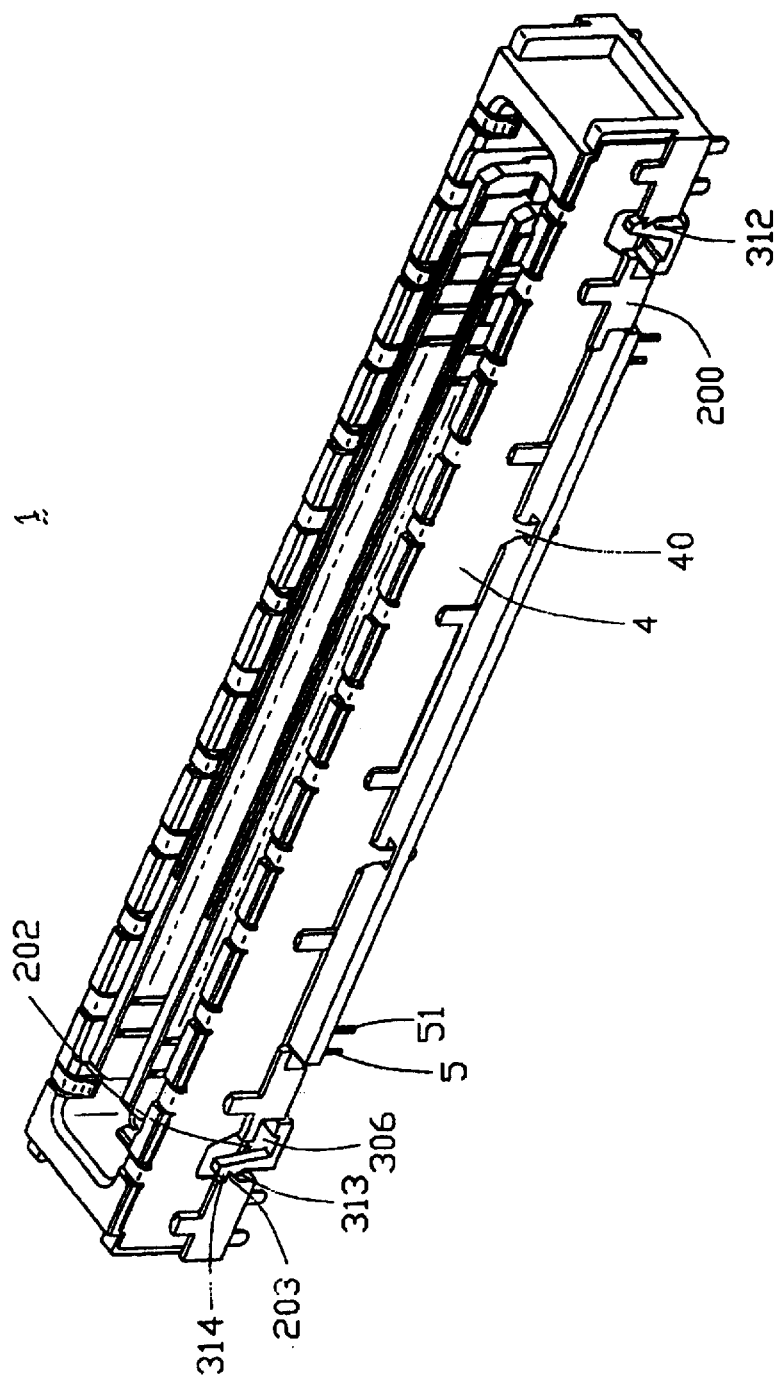
FIG. 4 is an assembled perspective view of the connector of FIG. 1 with the spacer in a first position.

Referring to FIGS. 1, 3 and 4, the spacer 3 has an elongated plate 30 with a top surface 302 and a bottom surface 301 opposite to the top surface 302. The elongated plate 30 defines a plurality of positioning holes 303 extending therethrough for positioning tail portion 51 of the terminals 5, a plurality of rectangular holes 304 for allowing soldering tabs 40 of the shell 4 to downwardly extend therethrough and two pairs of cutouts 305 corresponding to the projections 200. A pair of recesses 306 are defined at each end of the elongated plate 30. A resilient book 31 extends upwardly from corresponding recess for cooperating with a corresponding engaging portion 203 of the insulative housing 2. Each hook 31 includes a first retention portion 32 and a second retention portion 33 positioned below and spaced from the first retention portion 32. The first retention portion 32 has a first guiding surface 314 and a first engaging surface 311, and the second retention portion 33 has a second guiding surface 313 and a second engaging surface 312.

Referring to FIGS. 1–4, in assembly, the shells 4 are respectively attached to corresponding sidewalls 21 of the housing 2 from a top end of the connector 1. The spacer 3 is assembled onto the insulative housing 2 from a bottom end of the connector 1 with the rectangular holes 304 thereof aligning with soldering tabs 40 of the shell 4 and the holes 303 thereof aligning with tail portions 51 of the terminals 5. Each hook 31 is compressed inwardly by the first guiding surface 314 to retentively engage with the first engaging surface 311 of the first retention portion 32 whereby the spacer 3 can be initially retained to the housing 2 in a first position. Concurrently, the tail portions 51 of the terminals 5 are inserted through the holes 303 of the spacer 3 and the soldering tabs 40 of the shell 4 are inserted through the rectangular holes 304 of the spacer 3 for initial orientation. Thereafter, the projections 200 of the housing 2 are inserted into corresponding cutouts 305 of the spacer 3.

Figure 5:
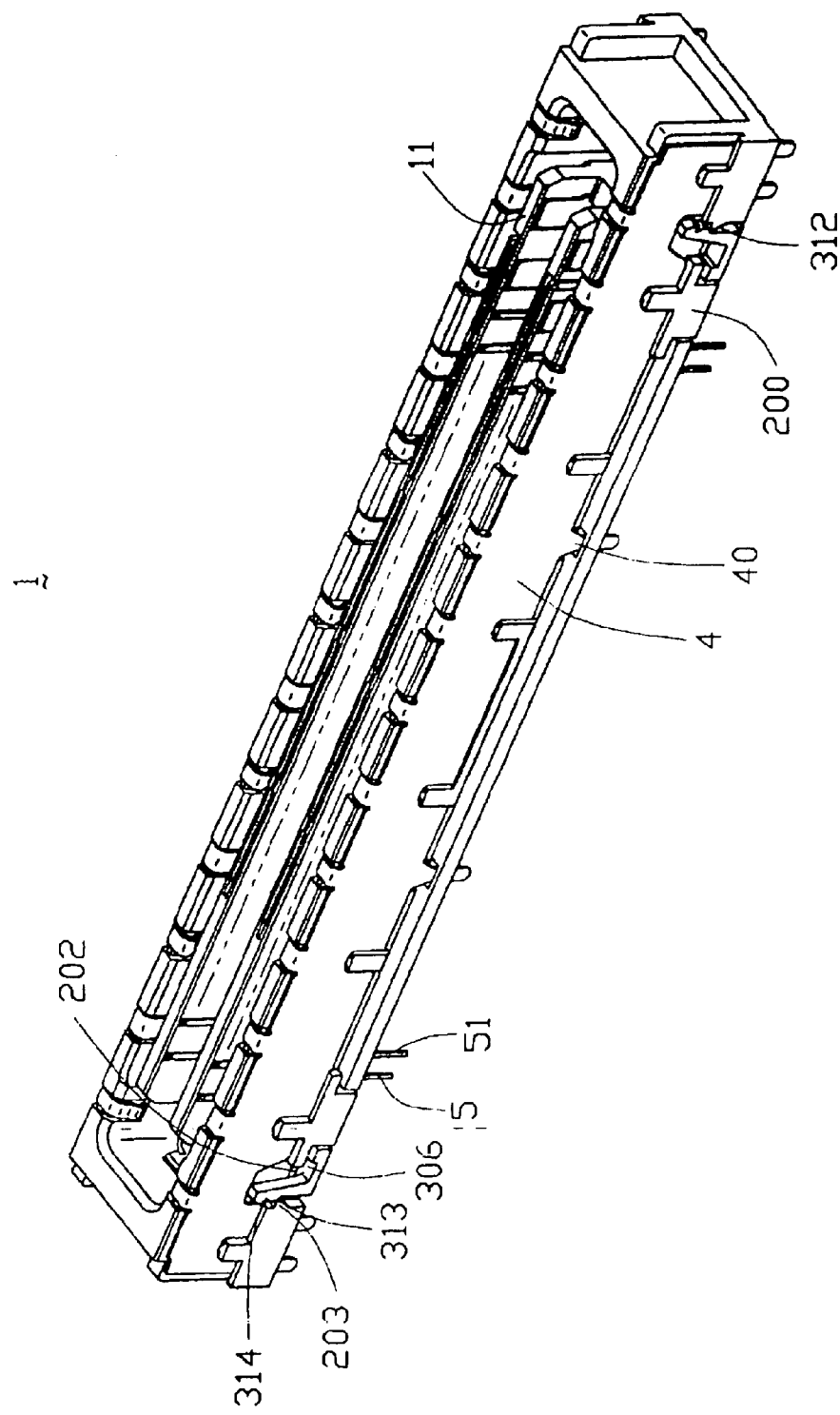
FIG. 5 is a perspective view of the connector of FIG. 1 with the spacer in a second position.

When the connector 1 is used for being mounting on the printed circuit board, as shown in FIG. 5, each hook 31 of the spacer 3 is inwardly pressed again through the second guiding surface 313 of the second retention portion 33 to retentively engage with the second engaging surface 312 to be in a second position. The embossments 201 of the housing 2 engage with corresponding recesses 306, whereby the spacer 3 can be finally retained to the housing 2. Concurrently, the tail portions 51 of the terminals 5 are precisely inserted through both of the holes 303 of the spacer 3 and apertures defined the printed circuit board (not shown).

By engagement between the engaging portion 203 of the housing 2 and the first and second retention portions 32, 33 of the spacer 3, respectively, the terminals 5 can be gradually oriented and guided in two stages through the holes 303 of the spacer 3 to be precisely inserted into corresponding apertures of the printed circuit board without buckling. Furthermore, the first retention portion 32 and the second retention portion 33 are formed on the spacer 3, which also lowers a height of the housing 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector, comprising:
   an insulative housing comprising a mating face at a top end thereof, an engaging face opposite to the mating face, opposite longitudinal walls connecting the mating face and the engaging face, a pair of engaging portions formed on each of and a plurality of passageways extending from the mating face to the engaging face;
   a plurality of conductive terminals each comprising a mating portion received in corresponding passageway of the insulative housing and a tail portion extending beyond the insulative housing; and
   a spacer comprising a pair of hooks and a plurality of positioning holes receiving the tail portions of the terminals extending therethrough, each hook comprising a first retention portion and a second retention portion, the first and the second retention portions of the spacer being respectively engagable with the engaging portions of the housing.

2. The electrical connector as claimed in claim 1, wherein the insulative housing comprises a mating cavity extending from the mating face toward the engaging face, and at least one mating tongue extending in the mating cavity, and wherein said passageways are defined in opposite side surfaces of the mating tongues.

3. The electrical connector as claimed in claim 1, wherein the insulative housing comprises a pair of blocks respectively formed on opposite ends thereof, said engaging portions projecting sidewardly from the blocks.

4. The electrical connector as claimed in claim 1, wherein the housing comprises a plurality of projections extending downwardly from opposite sidewalls thereof, the spacer defining a plurality of cutouts for receiving corresponding projections.

5. The electrical connector as claimed in claim 1, further comprising a shell comprising a pair of soldering tabs extending downwardly therefrom, the spacer defining a pair of rectangular holes for allowing soldering tabs of the shell to downwardly extend therethrough.

6. The electrical connector as claimed in claim 1, wherein the housing has a plurality of embossments formed on the engaging face of the housing at a bottom end thereof, the spacer defining a plurality of recesses for engaging with corresponding embossments.

7. An electrical connector comprising:
   an insulative housing defining an upright mating portion;
   a plurality of protrusions integrally formed on and laterally outwardly beyond two side walls of the housing;
   a plurality of terminals disposed in the housing, each of said terminals including a vertically downwardly extending tail, a metallic shell attached unto an exterior of each of said walls and
   an insulative housing spacer defining therein a plurality of through holes through which said tails of the contacts downwardly extend, respectively; wherein
   said spacer includes a plurality of hooks each defining two engaging sections at different levels to respectively latchably engage only a same one corresponding engaging portion formed on the corresponding protrusion, at different stages wherein said metall shell further includes a plurality of tail section and the spacer further includes a plurality of through apertures to have said tail downwardly extend therethrough.

8. The connector as claimed in claim 7, wherein said spacer includes at least a hook to latchably engage the housing, and wherein said shell defines a cutout to receive said hook therein without interference.

* * * * *